United States Patent [19]

Minami et al.

[11] Patent Number: 4,767,942
[45] Date of Patent: Aug. 30, 1988

[54] CURRENT MIRROR AMPLIFIER CIRCUIT

[75] Inventors: Hiroshi Minami; Koreaki Fujita, both of Itami, Japan

[73] Assignee: Mitsubishi Denki Kabushiki Kaisha, Japan

[21] Appl. No.: 46,509

[22] Filed: May 6, 1987

[30] Foreign Application Priority Data

May 7, 1986 [JP] Japan ................... 61-104292

[51] Int. Cl.$^4$ ............... H03K 3/01; H03K 3/353; H03F 3/45; H03F 3/04
[52] U.S. Cl. ................... 307/304; 307/296 R; 307/297; 330/257; 330/288
[58] Field of Search ............ 330/257, 288; 307/304, 307/296 R, 297

[56] References Cited

U.S. PATENT DOCUMENTS 4,509,147 4/1985 Tanimura et al. .................. 365/190
4,661,779 4/1987 Okamoto ............................. 330/257

OTHER PUBLICATIONS

1981 IEEE International Solid-State Circuits Conference; 0193-6530/81 100000-0014 Session I: Static RAMs, WAM1.2: "Hi-CMOSSI 4K Static RAM" Osamu Minato et al.

Primary Examiner—John Zazworsky
Assistant Examiner—M. R. Wambach
Attorney, Agent, or Firm—Saidman, Sterne, Kessler & Goldstein

[57] ABSTRACT

In a MOS transistor circuit (comprising a pair of current mirror circuits, each comprising: first and second MOS transistors having their gate electrodes connected together; third and fourth MOS transistors respectively connected in series with the first and second transistors the third and the fourth MOS transistors of the pair of current mirror circuits receiving a pair of complementary signals at their gate electrodes; and the nodes between the second and the fourth MOS transistors forming output nodes of the current mirror circuits), a pair of capacitors each coupling the output of one current mirror circuit to the gate electrodes of the first and the second MOS transistors of the other current mirror circuit. This provides positive feedback. The change in the outputs responsive to change in the inputs is thereby accelerated.

10 Claims, 2 Drawing Sheets

WITH COUPLING
CAPACITORS

WITHOUT
COUPLING
CAPACITORS 4,767,942

CURRENT MIRROR AMPLIFIER CIRCUIT

BACKGROUND OF THE INVENTION

The present invention relates to MOS (metal oxide semiconductor) transistor circuits, particularly those having a current mirror voltage amplifier circuit.

An example of a MOS transistor circuit comprising two current mirror voltage amplifier circuits is shown in FIG. 1. A first one (1) of the current mirror voltage amplifier circuits comprises PMOS (P-channel MOS) transistors TP1 and TP2, and NMOS (N-channel MOS) transistors TN1 and TN2. A second one (2) of the current mirror voltage amplifier circuits comprises PMOS transistors TP3 and TP4, and NMOS transistors TN3 and TN4. Each of the MOS transistors comprises first and second main electrodes and a gate electrode.

The PMOS transistors TP1 to TP4 have their first main electrodes connected to a power supply V, and their second main electrodes connected to the first main electrodes of the NMOS transistors TN1 to TN4. The transistors TP1 and TP2 have their gate electrodes connected to each other and to the first main electrode of the transistor TN1. The transistors TP3 and TP4 have their gate electrodes connected to the first main electrode of the transistor TN3. The NMOS transistors TN1 to TN4 have their second main electrodes connected to the ground G. The transistors TN1 and TN2 have their gate electrodes connected to the gate electrodes of the transistors TN4 and TN3, respectively. The transistors TN1 and TN4 have their gate electrodes connected to a first input signal line N5, while the transistors TN2 and TN3 have their gate electrodes connected to a second input signal line N6. The transistors TN2 and TN4 have their gate electrodes connected to a first and a second output signal lines N7 and N8.

The operation of the circuit will now be described. Initially, the input signal lines N5 and N6 are in an intermediate state, i.e., the input signals are neither at "H" nor "L" for the transistors TN1 to TN4. Assume for instance, the potential on the signal line N5 slightly rises and the potential on the signal line N6 slightly falls. In the first current mirror circuit 1 comprising the transistors TP1, TP2, TN1 and TN2, the NMOS transistor TN1 becomes slightly "ON", and the current from a node N1 to the ground G slightly increases, and the potential on the node N1 slightly falls. The PMOS transistors TP1 and TP2 become slightly ON, and a current flows to a node N2. But the NMOS transistor TN2 is in a slightly "OFF" state, so that the potential on the node N2 rises. The output signal line N7 therefore becomes "H".

In the second current mirror circuit 2 comprising the transistors TP3, TP4, TN3 and TN4, the NMOS transistor TN3 becomes slightly "OFF", and a current from a node N3 to the ground G slightly decreases, and the potential on the node N3 slightly rises. The PMOS transistor TP3 and TP4 becomes slightly "OFF", and a current flowing to a node N4 decreases. But the NMOS transistors TN4 is in a slightly "ON" state, so that the current from the node N4 to the ground G increases, and the potential on the node N4 falls. The output signal line N8 therefore becomes "L".

Thus the two current mirror circuits 1 and 2 operate independently of each other.

The above-described MOS transistor circuit has been used as a high-speed voltage amplifier circuit in a semiconductor memory device and the like. But today an amplifier circuit with even higher speed is desired.

SUMMARY OF THE INVENTION

An object of the invention is to provide a MOS transistor circuit capable of voltage amplification at a higher speed than before.

A MOS transistor circuit according to the invention comprises a pair of current mirror voltage amplifier circuits, generally similar to that described above, but distinguished by capacitive coupling of the output of each current mirror voltage amplifier circuit to the gate electrodes of the MOS transistors of the other current mirror voltage amplifier circuit that are connected to each other.

Because of the capacitive coupling, the output signal of each current mirror voltage amplifier circuit is transmitted to gate electrodes of the MOS transistors which determine the current through the respective MOS transistors. Application of the output to the gate electrodes accelerates the change in the currents and hence in the outputs. In other words the capacitive coupling provides a path for positive feedback. Accordingly, the voltage amplification is made at a higher speed.

DESCRIPTION OF THE PREFERRED EMBODIMENTS

Figure 1:
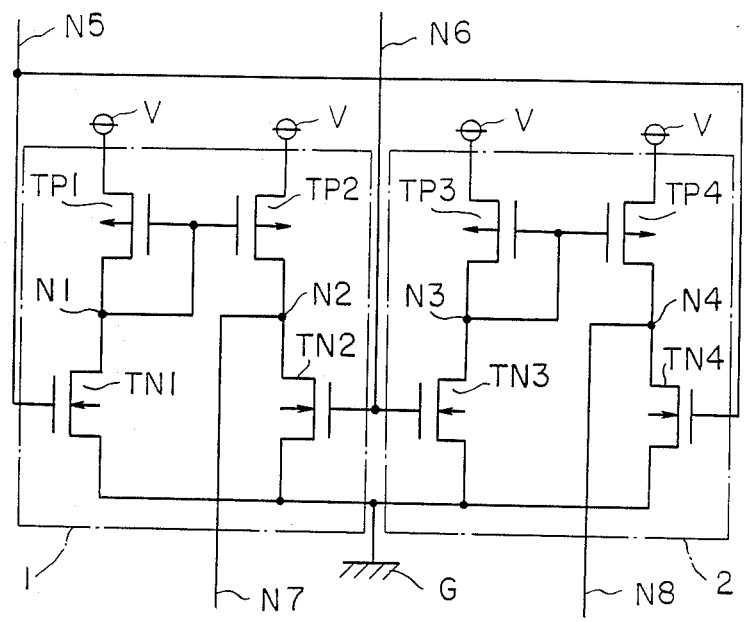
FIG. 1 is a circuit diagram showing a conventional MOS transistor circuit having current mirror amplifier circuits.
Figure 2:
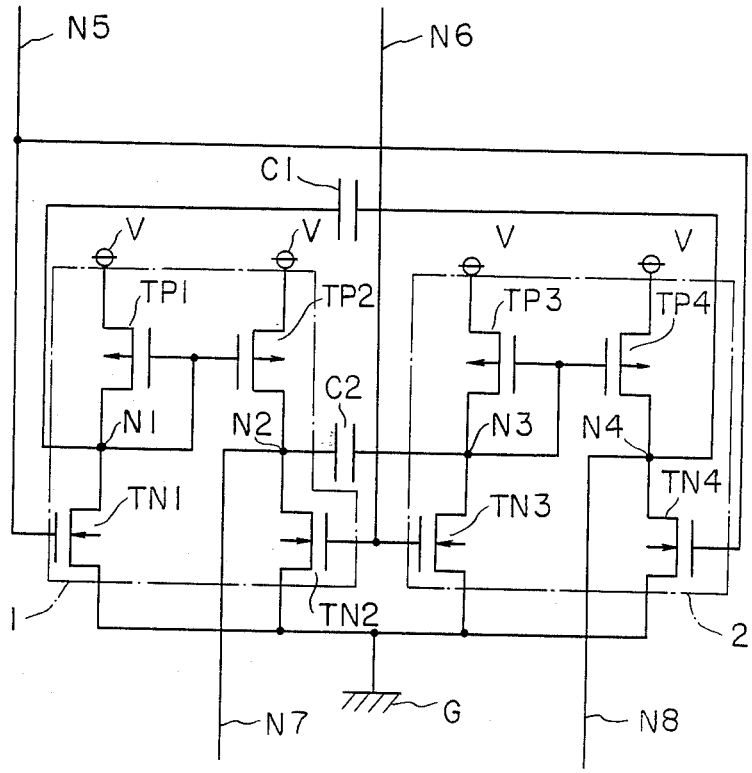
FIG. 2 is a MOS transistor circuit of an embodiment of the invention.

FIG. 2 shows a MOS transistor circuit having voltage amplifier circuits according to an embodiment of the invention. In the figure, reference numerals identical to those in FIG. 1 denote identical or similar components. The circuit configuration of FIG. 2 is generally identical to that of FIG. 1. But the circuit of FIG. 2 differs from the circuit of FIG. 1 in that is comprises a capacitor C1 coupling the first main electrode of the NMOS transistor TN4 with the gate electrodes of the PMOS transistors TP1 and TP2, and a capacitor C2 coupling the first main electrode of the NMOS transistor TN2 with the gate electrodes of the PMOS transistors TP3 and TP4. In other words, each of the capacitors C1 and C2 are connected to couple an output N4 or N2 of one of the current mirror amplifier circuits to the interconnected gate electrodes of the PMOS transistors of the other current mirror amplifier circuit.

Initially, the input signal lines N5 and N6 are in an intermediate state, i.e., the input signals are at a level which is neither at "H" nor "L" for the transistors TN1 to TN4.

Assume that the potential on the input signal line N5 slightly rises and the potential on the input signal line N6 slightly falls.

In the first current mirror circuit 1 comprising the transistors TP1, TP2, TN1 and TN2, the NMOS transistor TN1 become slightly "ON" and the current from the node N1 to the ground G increases, and the potential on the node N1 falls, as described with reference to FIG. 1.

In the circuit of FIG. 2, there is an additional contribution to the falling of the potential on the node N1. That is falling of the potential on the node N4, i.e., the output of the second current mirror circuit 2, contributes, by virtue of the capacitor C1 coupling the nodes N4 to N1, to the falling of the potential on the node N1. Such contributions accelerates the falling of the potential on the node N1. Thus, the falling of the potential on the node N1 is quicker than in the prior art of FIG. 1. The circuit of FIG. 2 is therefore quicker than the circuit of FIG. 1 in the operations, by which the PMOS transistor TP1 and TP2 becomes "ON" and a current flows to the node N2, and with the NMOS transistor TN2 being slightly "OFF", the potential on the node N7 rises and the output signal line N7 become "H".

The second current mirror circuit 2 comprising the transistors TP2, TP4, TN3 and TN4 operate in a similar manner. The voltage amplification function is thereby improved.

Figure 3A:
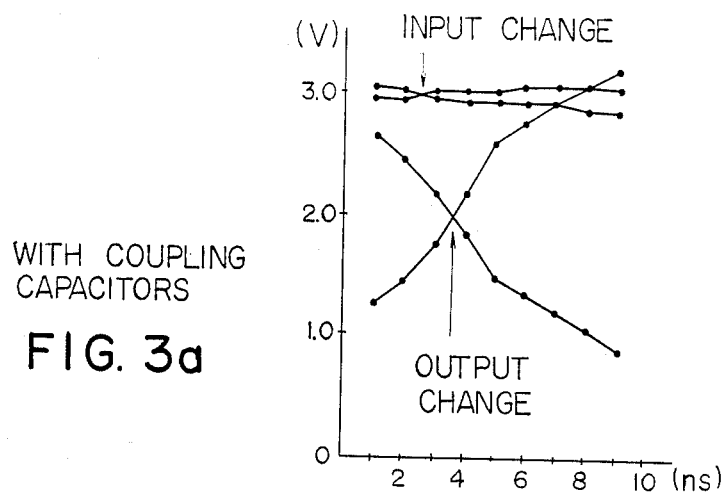
FIGS. 3a and 3b are waveform diagrams obtained by simulating the circuit of the embodiment and the conventional circuit.
Figure 3B:
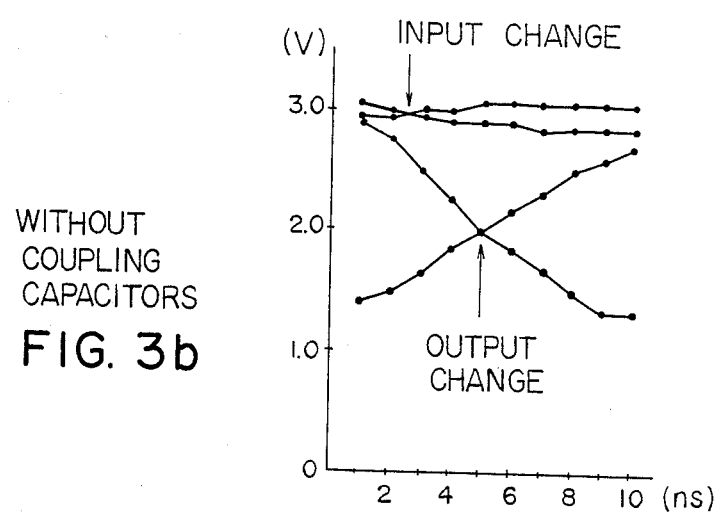

FIGS. 3a and 3b are waveform diagrams which were obtained by simulating the circuit of the embodiment with the capacitors and the conventional circuit without the capacitors. It was assumed that the power supply voltage is 4.5 V, the capacitors C1 and C2 are 3.0 pF, and the parameters of the respective semiconductor elements are as shown below:

|  | CHANNEL LENGTH L (microns) | CHANNEL WIDTH W (microns) |
|---|---|---|
| TP1, TP3 | 2.0 | 10.5 |
| TP2, TP4 | 2.0 | 21.0 |
| TN1, TN3 | 1.5 | 3.5 |
| TN2, TN4 | 1.5 | 7.0 |

The gate capacitance was $1.456 \times 10^{-3}$ pF/micrometers$^2$ in each case.

It will be seen from FIGS. 3a and 3b, that the time lag from the input change to output change has been reduced by 60% by the improvement of the embodiment of FIG. 2.

The circuit shown in FIG. 2 can be incorporated in a sense amplifier for a static RAM to receive, on the first and the second input signal lines, complementary signals from a memory cell. An example of such a sense amplifier is shown in the U.S. Pat. No. 4,509,147, disclosure thereof being incorporated herein by reference. The circuit of FIG. 2 of the present application can be used in substitution for the circuits P1 and P2 shown in FIG. 6 of the above-referenced U.S. Patent.

As has been described according to the invention, the output node of each of the current mirror amplifier circuits is capacitively coupled to the gate electrodes of the MOS transistors of the other current mirror amplifier circuit that are connected to each other, so that when signals of the opposite phases are input to the pair of input transistors of the circuit, the time required for the amplification, i.e., the time lag is reduced.

What is claimed is:

1. A MOS transistor circuit, comprising:
   first and second power supply lines,
   first and second input signal lines,
   first and second output signal lines,
   first and second current mirror circuits, each comprising:
   a first MOS semiconductor element of a first channel type
   having a first main electrode connected to the first power supply line, and
   having a second main electrode and a gate electrode connected to each other,
   a second MOS semiconductor element of the first channel type
   having a first main electrode connected to the first power supply line,
   having a gate electrode connected to the second main electrode of the first MOS semiconductor element, and
   having a second main electrode,
   a third MOS semiconductor element of a second channel type
   having a first main electrode connected to the second electrode of the first MOS semiconductor element, and
   having a second main electrode connected to the second power supply line, and
   a fourth MOS semiconductor element of the second channel type
   having a first main electrode connected to the second electrode of the second MOS semiconductor element, and
   having a second main electrode connected to the second power supply line,
   the third MOS semiconductor element of the first current mirror circuit and the fourth MOS semiconductor element of the second current mirror circuit having their gate electrodes connected to the first input signal line,
   the third MOS semiconductor element of the second current mirror circuit and the fourth MOS semiconductor element of the first current mirror circuit having their gate electrodes connected to the second input signal line,
   the first main electrode of the fourth MOS semiconductor element of the first current mirror circuit being connected to the first output signal line,
   the first main electrode of the fourth MOS semiconductor element of the second current mirror circuit being connected to the second output signal line,
   a first capacitor coupling the first output signal line to the gate electrodes of the first and the second MOS semiconductor elements of the second current mirror circuit that are connected to each other, and
   a second capacitor coupling the second output signal line to the gate electrodes of the first and the second MOS semiconductor elements of the first current mirror circuit,
   whereby said capacitors provide feedback from the first and the second output signal lines and to the gate electrodes of the first and the second MOS semiconductor elements of the second and the first current mirror circuits.

2. A circuit according to claim 1, wherein the MOS semiconductor elements are MOS transistors.

3. A circuit according to claim 1, wherein said MOS semiconductor elements of said first channel type are P-channel MOS semiconductor elements, and said MOS semiconductor elements of said second channel type are N-channel MOS semiconductor elements.

4. A MOS transistor circuit comprising first and second current mirror voltage amplifier circuits,
   each of said current mirror circuits comprising
   first and second MOS transistors having their gate electrodes connected together, a third MOS transistor connected in series with said first transistor, and a fourth MOS transistor connected in series with said second transistor, the node between said second and fourth transistors forming the output node of said current mirror circuit, and the node between said first and third transistors being connected to the gate electrodes of said first and second transistors; and said third MOS transistor of said first current mirror circuit and said fourth MOS transistor of said second current mirror circuit having gate electrodes connected to receive one of a pair of complementary signals, said third MOS transistor of said second current mirror circuit and said fourth MOS transistor of said first current mirror circuit having gate electrodes connected to receive the other of the pair of complementary signals, and a pair of capacitors, each coupling the output node of a respective one of said current mirror circuits with the gate electrodes of said first and second MOS transistors of the other said current mirror circuit.

5. A MOS transistor circuit according to claim 4, wherein said first and second MOS transistors are of a first channel type, and said third and fourth MOS transistors are of a second channel type.

6. A MOS transistor circuit according to claim 5, wherein said first channel type is P-type, and said second channel type is N-type.

7. A MOS transistor circuit according to claim 6, wherein said first and second MOS transistors have first main electrodes connected to a first voltage supply, and have second main electrodes, and said third and fourth MOS transistors have first main electrodes connected to said second main electrodes of said first and second MOS transistors, and have second main electrodes connected to a second voltage supply which has a potential lower than that of the first voltage supply.

8. A static random access memory, comprising:

a plurality of memory cells, each of which delivers a pair of signals complementary to each other;

and at least one sense amplifier selectably connectable to a selected one of said cells;

wherein said sense amplifier comprises:

first and second voltage amplifier circuits, each including:

first and second P-channel field-effect transistors having respective gate electrodes connected together, and a third N-channel field-effect transistor connected in series with said first transistor, and a fourth N-channel field-effect transistor connected in series with said second transistor, the node between said second and fourth transistors forming the output node of said voltage amplifier circuit, and the node between said first and third transistors being connected to the gate electrodes of said first and second transistors;

said third transistor of said first voltage amplifier circuit and said fourth transistor of said second voltage amplifier circuit having respective gate electrodes each connected to receive a first one of a pair of complementary bitline signals, said third transistor of said second voltage amplifier circuit and said fourth transistor of said first voltage amplifier circuit having respective gate electrodes each connected to receive the other one of the pair of complementary bitline signals, and a first capacitor coupling said output node of said first voltage amplifier circuit to the gate electrodes of said first and second transistors of said second voltage amplifier circuit, and a second capacitor coupling said output node of said second voltage amplifier circuit to the gate electrodes of said first and second transistors of said first voltage amplifier circuit.

9. A circuit, comprising:

first and second voltage amplifier circuits, each including:

first and second P-channel field-effect transistors having respective gate electrodes connected together, and a third N-channel field-effect transistor connected in series with said first transistor, and a fourth N-channel field-effect transistor connected in series with said second transistor, the node between said second and fourth transistors forming the output node of said voltage amplifier circuit, and the node between said first and third transistors being connected to the gate electrodes of said first and second transistors; and said third transistor of said first voltage amplifier circuit and said fourth transistor of said second voltage amplifier circuit having respective gate electrodes each connected to receive a first one of a pair of complementary signals, said third transistor of said second voltage amplifier circuit and said fourth transistor of said first voltage amplifier circuit having respective gate electrodes each connected to receive the other one of the pair of complementary signals, and a first capacitor coupling said output node of said first voltage amplifier circuit to the gate electrodes of said first and second transistors of said second voltage amplifier circuit, and a second capacitor coupling said output node of said second voltage amplifier circuit to the gate electrodes of said first and second transistors of said first voltage amplifier circuit.

10. The circuit of claim 9, wherein, in both said first and second voltage amplifier circuits, said fourth transistor has a width-to-length ratio substantially larger than that of said third transistor.

* * * * *